(12) United States Patent
Park et al.

(10) Patent No.: US 6,562,666 B1
(45) Date of Patent: May 13, 2003

(54) INTEGRATED CIRCUITS WITH REDUCED SUBSTRATE CAPACITANCE

(75) Inventors: Heemyong Park, LaGrangeville, NY (US); Fariborz Assaderaghi, Mahopac, NY (US); Jack A. Mandelman, Stormville, NY (US); Ghavam G. Shahidi, Yorktown Heights, NY (US); Lawrence F. Wagner, Jr., Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 09/702,314

(22) Filed: Oct. 31, 2000

(51) Int. Cl.[7] ............................ H01L 21/00; H01L 21/76
(52) U.S. Cl. ........................................ 438/149; 438/450
(58) Field of Search ................................ 438/149, 154, 438/549, 450

(56) References Cited

U.S. PATENT DOCUMENTS

| | | | |
|---|---|---|---|
| 5,185,535 A | * | 2/1993 | Farb et al. .................. 257/351 |
| 5,294,821 A | | 3/1994 | Iwamatsu .................... 257/351 |
| 5,426,062 A | | 6/1995 | Hwang ........................ 437/21 |
| 5,523,602 A | | 6/1996 | Horiuchi et al. ............ 257/347 |
| 5,663,588 A | | 9/1997 | Suzuki et al. ............... 257/350 |
| 5,760,442 A | | 6/1998 | Shigyo et al. .............. 257/347 |
| 5,795,810 A | | 8/1998 | Houston ...................... 438/404 |
| 5,810,994 A | | 9/1998 | Lee et al. ................... 205/656 |
| 5,923,067 A | | 7/1999 | Voldman ..................... 257/349 |
| 5,939,755 A | | 8/1999 | Takeuchi et al. ............ 257/347 |
| 5,955,767 A | | 9/1999 | Liu et al. .................... 257/369 |
| 5,989,981 A | | 11/1999 | Nakashima et al. ........ 438/459 |
| 5,994,759 A | | 11/1999 | Darmawan et al. ........ 257/538 |
| 6,100,567 A | * | 8/2000 | Burr .......................... 257/365 |

OTHER PUBLICATIONS

Sze, "Semiconductor Devices Physics and Technology", John Wiley & Sons, New York, 1985, pp 74–82.*

* cited by examiner

Primary Examiner—William David Coleman
(74) Attorney, Agent, or Firm—Eric W. Petraske

(57) ABSTRACT

Capacitance between source/drain and p-type substrate in SOI CMOS circuits is reduced by implanting an n-type layer below the oxide layer, thereby forming a fully depleted region that adds to the thickness of the oxide layer, while creating a junction capacitance region that reduces the total device to substrate capacitance.

15 Claims, 7 Drawing Sheets

INTEGRATED CIRCUITS WITH REDUCED SUBSTRATE CAPACITANCE

FIELD OF THE INVENTION

The field of the invention is SOI (Silicon On Insulator) CMOS circuits employing wafers formed using any one of possible methods, such as SIMOX, bond and etchback, SMARTCUT, etc.

BACKGROUND OF THE INVENTION

In the field of SIMOX SOI wafer manufacture, it is known that the implantation process to produce industry standard wafers having an insulating layer about 0.4 $\mu$m thick is time consuming and causes defects in the silicon device layer. The art has experimented with reducing both the magnitude of the oxygen implant dose and the thickness of the implanted layer.

A significant drawback of the use of a lower thickness buried oxide (BOX) is that the capacitance from the sources and drains of the transistors to the substrate below the BOX increases as the thickness is reduced. That capacitance increase is reflected in a reduction of circuit performance. The same capacitance increase will also apply to other components such as diodes, resistors, and inductors.

U.S. Pat. No. 5,994,759 teaches the formation of a doped layer under the BOX, creating an n-type layer in a p-type substrate, and then biasing this layer to form a thick depleted layer. In that approach, however, the n-type layer creates a ground plane underneath the BOX. The capacitance from the sources and drains and other circuit elements to the ground plane will be the same as, or greater than the capacitance to the original substrate.

The art has sought a thinner BOX layer having the capacitance of the thicker BOX without success.

SUMMARY OF THE INVENTION

The invention relates to a method of decreasing capacitance between circuit elements in SOI CMOS circuits and the p-doped substrate below the buried oxide (BOX) layer by implanting a lightly doped electrically unbiased area of n-type dopant at the bottom of the BOX, preferably thereby forming a fully-depleted region.

DESCRIPTION OF THE PREFERRED EMBODIMENT

Figure 1:
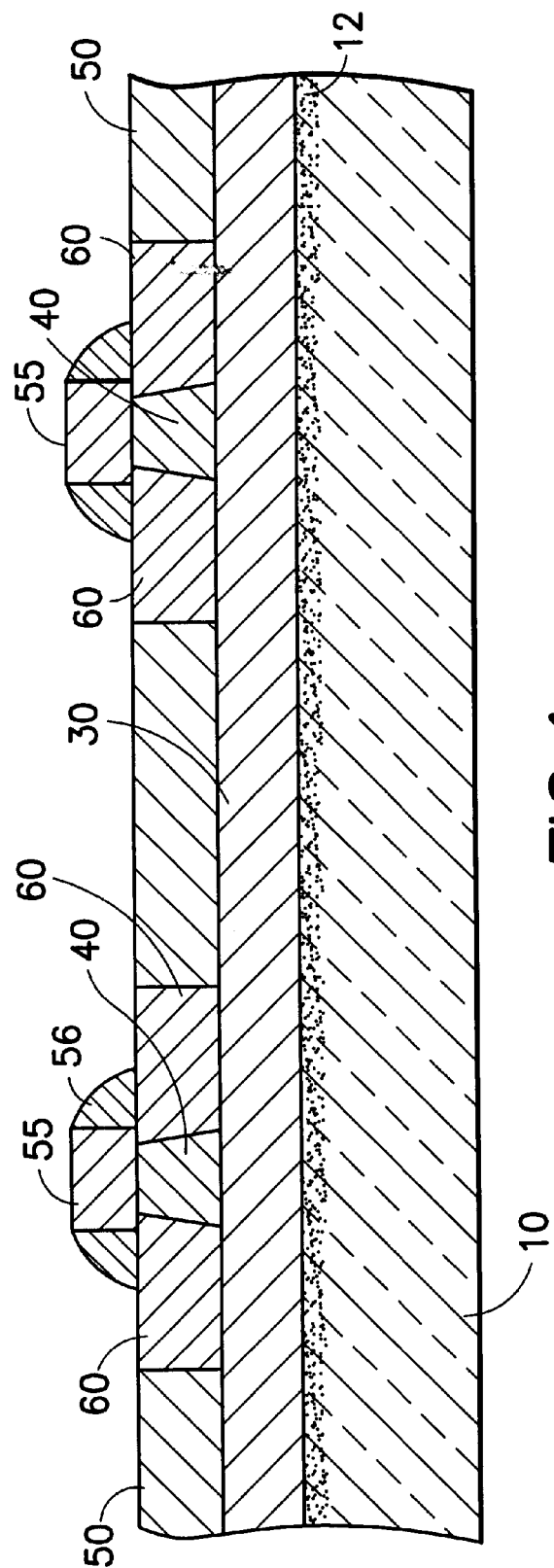
FIGS. 1–4 show the capacitance of various prior art embodiments.

Capacitance associated with an insulating region such as an oxide layer or a depletion region in silicon depends on the thickness of the region, the dielectric constant of the region, and the area of the conducting layers above and below the region. When the area of the conducting regions above and below are not the same, the relevant area is approximately the smaller of the two. Exact engineering calculations can be made to make this more precise for a specified structure. The conducting regions do not have to be adjacent to the layer in question for the case of several different insulating layers stacked together.

The capacitance contribution from the BOX layer is $$C_{BOX} = A_{BOX} \epsilon_{ox} / t_{ox} \qquad (1)$$

where $A_{BOX}$ is approximately the area of the relevant device conducting region above the BOX such as the FET source, drain or body, or the area of some other device. The conducting region below the BOX is usually the p-type substrate which has a much larger area, and hence has little effect on the capacitance formula;

$\epsilon_{ox}$ is the oxide dielectric constant; and $t_{ox}$ is the thickness of the BOX layer.

Note that when $t_{ox}$ becomes smaller in the case of the thin BOX, the $C_{BOX}$ contribution becomes larger.

In the usual case of a p-type substrate below the BOX, there are sometimes depletion layers in the top of the p-type substrate, the bottom of the FET sources and drains, or the FET bodies. The thickness of these depletion regions depends on the relative bias difference between these regions and the p-type substrate and/or the doping concentrations of these regions. Under some bias conditions, these layers could be neutral or accumulated and have no depletion at all.

The capacitance contribution from a depleted region in silicon is given by $$C_{DEP} = A_{DEP} \epsilon_{SI} / t_{DEP} \qquad (2)$$

where $A_{DEP}$ is approximately the smaller of the areas of the conducting regions above or below;

$\epsilon_{SI}$ is the silicon dielectric constant; and $t_{DEP}$ is the thickness of the depletion region which depends on the bias applied to the region, and the doping of the regions.

When several insulating layers are stacked together, the capacitance contributions are said to be "in series" and the total net capacitance is determined by the reciprocal rule:

$$\frac{1}{C_{TOTAL}} = \frac{1}{C_1} + \frac{1}{C_2} + \frac{1}{C_3} + \cdots \qquad (3)$$

where $C_{TOTAL}$ is the capacitance of the combined structure; and $C_1$, $C_2$, $C_3$, etc. are the contributions of each insulating layer.

For example, consider the case of an nfet n+ source over the BOX, and the usual p-type substrate below the BOX. Suppose there is a depletion layer in the n+ source and the p-type substrate. Due to the high doping in the source, the thickness of the depletion layer in the n+ source will be relatively small, and due to the low doping in the p-substrate, the thickness of the depletion layer in the substrate will be relatively larger.

The combined capacitance $C_{TOTAL}$ of the n+ source to the p-type substrate will be approximately determined by $$\frac{1}{C_{TOTAL}} = \frac{1}{C_{N+}} + \frac{1}{C_{BOX}} + \frac{1}{C_{P-}} \qquad (4a)$$

$$= \frac{t_{n+}}{A \epsilon_{SI}} + \frac{t_{box}}{A \epsilon_{ox}} + \frac{t_{p-}}{A \epsilon_{SI}}$$

where
- A is the relevant area which is approximately the area of the n+
- $t_{n+}$ is the small thickness of the depletion region in the n+ source;
- $t_{P-}$ is the larger thickness of the depletion region in the p-substrate; and
- $t_{BOX}$ is the thickness of the BOX.

Note that since $t_{n+}$ is very small, the contribution to the right hand side of the equation from $C_{N+}$ can usually be neglected. That is, $C_{N+}$ is very large. Note also that a larger $t_{P-}$ would reduce $C_{TOTAL}$ by increasing the right hand side of the equation.

Now, consider the effect of an n-region implanted into the p-type substrate. For convenience, Table I summarizes the possible embodiments this n-region can take, and illustrates the differences between prior art and this invention.

The columns of Table I are defined as follows:

Case: number assigned to each embodiment

Notes: short description

P-substrate only: standard technology, no n-region

Uniform: n-type layer is implanted with substantially the same doping and thickness over the entire wafer.

Patterned: the n-type layer is implanted only in selected portions of the p-type substrate Biased: a reach through contact from the wafer surface through the oxide to the n-region is formed in order to apply an electrical bias to the n-region Floating: no contact is made to the n-region so that it seeks its own electrical potential Conducting: the n-region has a sufficiently low resistance that it keeps the same electrical potential over its entire area Fully Depleted: the n-type doping is sufficiently light that it is depleted of free carriers. The depletion region from the p-n junction with the substrate then completely covers the n-region. The term "fully depleted" also includes the intrinsic case where the n-type doping approximately equals the p-type doping. When this latter condition exists the "fully depleted" region can be made very thick. A "fully depleted" region has essentially no free carriers so it cannot be electrically biased. It has essentially infinite lateral resistance so that adjacent portions are completely isolated.

TABLE 1

Case #1 Prior Art

Case #1 in FIG. 1 is the standard SOI device configuration. FIG. 1 shows two isolated FET structures, each consisting of a gate 55, source/drain diffusions 60, and a body region 40. These FET's are isolated laterally by a shallow trench 50, and from below by BOX 30. Below BOX 30 is the p-type substrate 10 which may or may not have a depletion region 12.

The capacitance from the device regions 60, 40 to the substrate 10 is given by $C_{DEV-SUB}$ $$\frac{1}{C_{DEVSUB}} = \frac{1'}{C_{BOX}} + \frac{1}{C_{12}} \approx \frac{t_{box}}{A_{DEV}\varepsilon_{ox}} + \frac{t_{12}}{A_{DEV}\varepsilon_{SI}} \quad (4b)$$

where $C_{box}$ is the contribution from the back oxide BOX region 30 according to Equation 1 and $C_{12}$ is the contribution from the thickness of the depletion region 12 according to Equation 2. These capacitances are combined as in Equation 3 to yield $C_{DEV-SUB}$, the net capacitance from a device region to the substrate. $A_{DEV}$ is the area of a device region such as a source or drain 60 or the body 40, or another type of device. We have neglected the small contribution from a depletion region in the device itself. According to Equation 4, when the thickness of the back oxide, $t_{box}$, is reduced, the capacitance $C_{DEV-SUB}$ will increase. It is the object of this invention to decrease the capacitance $C_{DEV-SUB}$ while keeping the reduced $t_{box}$.

Case #2 Prior Art

Figure 2:
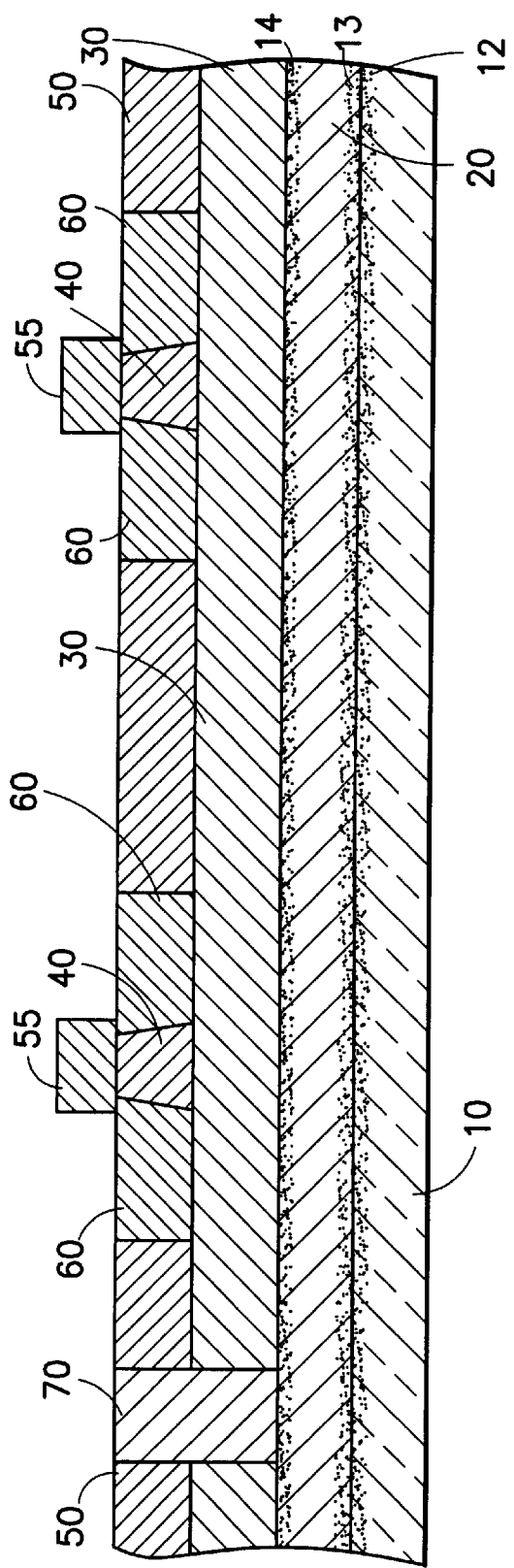

Case #2 represents prior art as discussed in U.S. Pat. No. 5,994,759. As shown in FIG. 2, a conducting n-type layer 20 had been implanted into the top surface of the p-type substrate 10. An electrical bias is applied to the n-layer 20 by a reach through contact region 70 formed through the trench isolation 50 and the back oxide BOX 30.

This n-region 20 can have a top depletion region 14. The lower depletion region −13 combines with the p-substrate depletion region 12 to form the total p-n junction depletion region. Applying a bias through the reach through region 70 can increase the thickness of the depletion regions 12 and 13, thereby reducing the p-n junction capacitance.

The capacitance from the device to the substrate will be given by $$\frac{1}{C_{DEVSUB}} = \frac{1}{C_{BOX}} + \frac{1}{C_{14}} + \frac{1}{C_{12}} + \frac{1}{C_{13}} \quad (5)$$

| | | N-REGION DETAILS | | | | |
| | | Implanted N-Region | | | | |
| Notes | p-substrate only | Uniform | Patterned | Biased | Floating | Conducting | Fully Depleted |
|---|---|---|---|---|---|---|---|
| 1 Standard Technology | X | | | | | | |
| 2 Prior Art | | X | | X | | X | |
| 3 Prior Art | | | X | X | | X | |
| 4 Other | | X | | | X | X | |
| 5 This Patent | | | X | | X | X | |
| 6 This Patent | | X | | | X | | X |
| 7 This Patent | | | X | | X | | X |

-continued $$\approx \frac{t_{box}}{A_{DEV}\varepsilon_{ox}} + \frac{t_{14}}{A_{DEV}\varepsilon_{SI}} + \frac{t_{12}+t_{13}}{A_{N-REGION}\varepsilon_{SI}}$$

The total area of the N-region 20, which extends throughout the entire wafer or chip, is used for $C_{12}$ and $C_{13}$ since the n-region is a conducting plane. Since $A_{N-region}$ is very large, $C_{12}$ and $C_{13}$ make no significant improvement to the capacitance $C_{DEV-SUB}$. In addition, $t_{14}$ is equal or less than $t_{12}$ in Equation 4 so there is no improvement to $C_{DEV-SUB}$.

Since the n-region 20 also forms a conducting plane we must also consider the capacitance between the device and the n-region.

$$\frac{1}{C_{DEV-N}} = \frac{1}{C_{BOX}} + \frac{1}{C_{14}} \approx \frac{t_{BOX}}{A_{DEV}\varepsilon_{ox}} + \frac{t_{14}}{A_{DEV}\varepsilon_{SI}} \quad (6)$$

Thus the capacitance $C_{DEV-N}$ is greater than $C_{DEV-SUB}$ and both are equal or slightly greater than $C_{DEV-SUB}$ in case #1, equation 4.

Therefore case #2 does not yield the desired improvement.

Case #3 Prior Art

Figure 3:
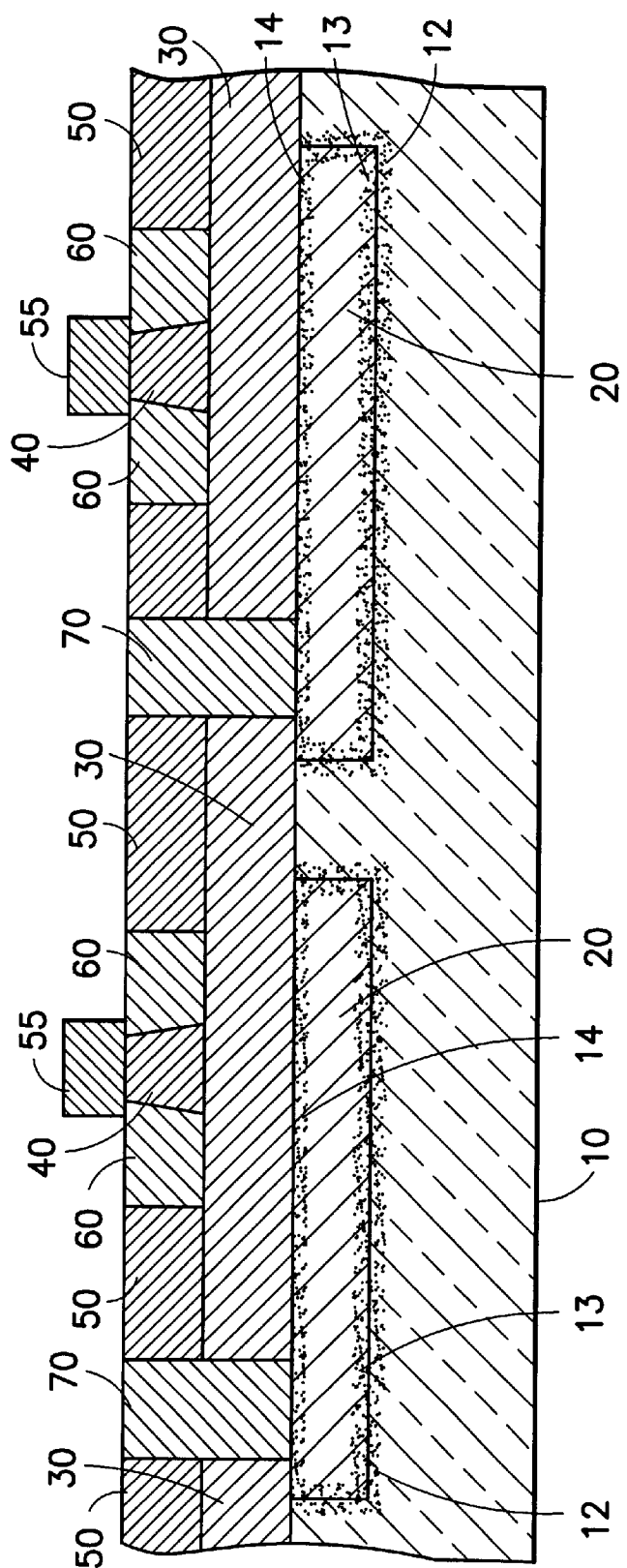

Case #3 shown in FIG. 3, represents prior art as discussed in U.S. Pat. No. 5,994,759. Case #3 is the same as case #2 except that the n-regions 20 have been patterned so they do not extend over the entire wafer or chip.

Equation 5 describes the capacitance $C_{DEV-SUB}$, however since $A_{n-region}$ is much smaller in the patterned case, and since $t_{12}$ and $t_{13}$ can be increased by applying a bias, the capacitance $C_{DEV-SUB}$ can be made much smaller than in Case #1.

This does not represent an improvement, however, since Equation 6 still applies. The capacitance from the device to the substrate $C_{DEV-SUB}$ had been replaced by a capacitance from the device to the n-region 20, $C_{DEV-N}$, which is equal or greater than the capacitance $C_{DEV-SUB}$ in Case #1.

We conclude that the Prior art of U.S. Pat. No. 5,994,759 described in Cases #2 and #3 does not provide an advantage over standard technology Case #1.

Case #4

Figure 4:
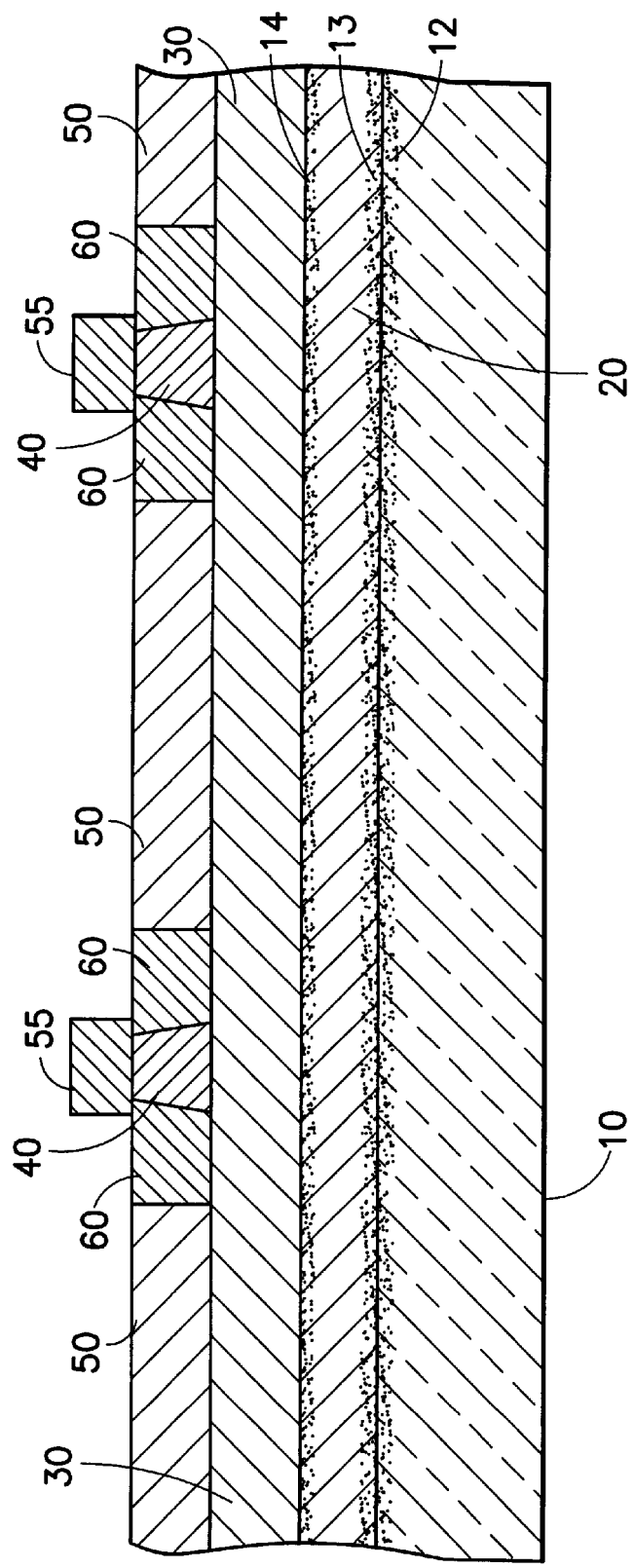

Case #4 in FIG. 4 is the same as Case #2 in FIG. 2 except that the reach through contact 70 has been omitted. The implanted n-region 20 is uniformly implanted over the entire wafer or chip, but it is not biased so it seeks its own electrical potential. The capacitance between the devices and the substrate $C_{DEV-SUB}$ is given by Equation 5. However, as in Case #2, the uniform conducting n-region covers the entire wafer or chip so that the area $A_{n-region}$ is large, and the capacitance between the n-region and the substrate is large. There is no improvement from this large series capacitance so $C_{DEV-SUB}$ is approximately the same as $C_{DEV-N}$ which represents no improvement.

Case #5

Figure 5:
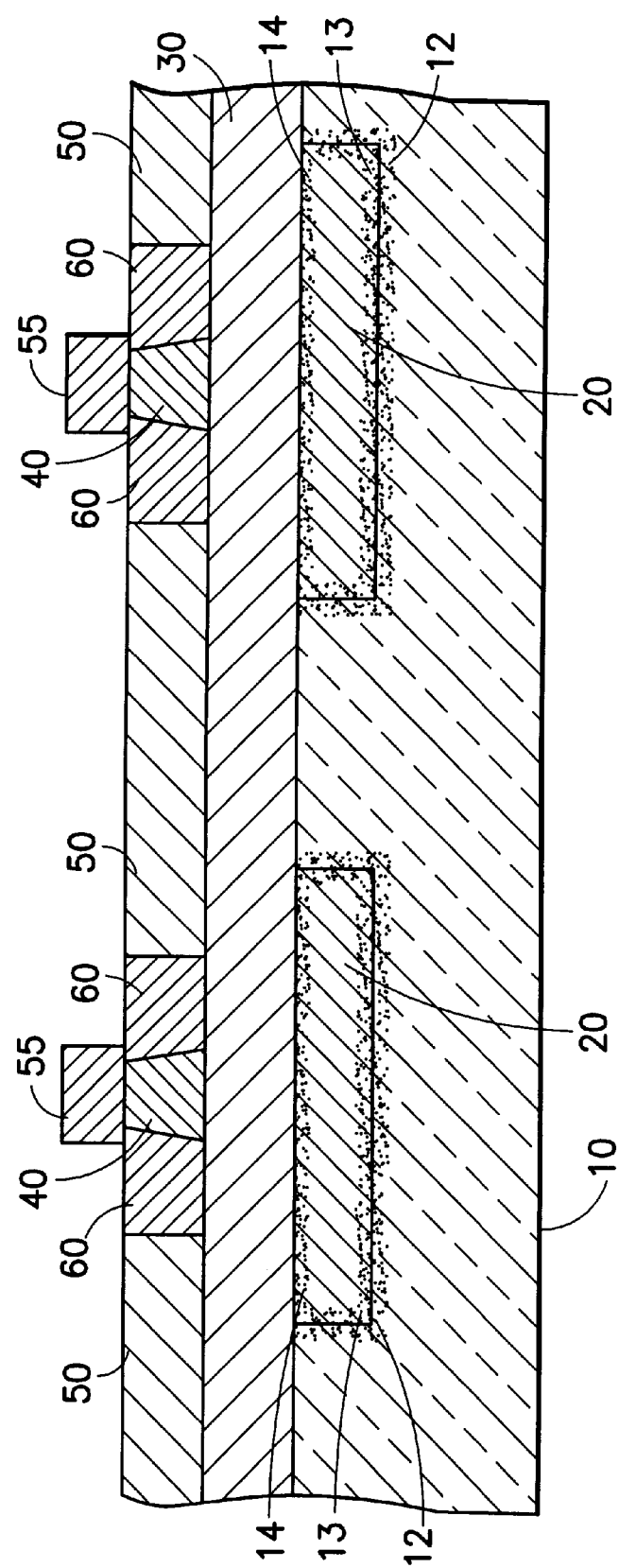
FIGS. 5–7 show the capacitance of various embodiments of this invention.

Case #5 represents the first embodiment of the present invention. Case #5 in FIG. 5 is the same as Case #3 in FIG. 3 except that the reach through contact 70 has been omitted. The patterned implanted n-regions 20 are electrically floating so they seek their own potential.

The capacitance, $C_{DEV-SUB}$, is given by Equation #5, but now as in Case #3 the area of the n-regions 20 is small so the smaller series capacitance of the n-region to the substrate reduces the total device to substrate capacitance giving rise to the capacitance reduction that is the purpose of this invention.

Note that the capacitance between the device and the n-regions 20 does not matter since there is no external bias contact to add or remove charge.

Case #6

Case #6 is the preferred embodiment of this invention.

Figure 6:
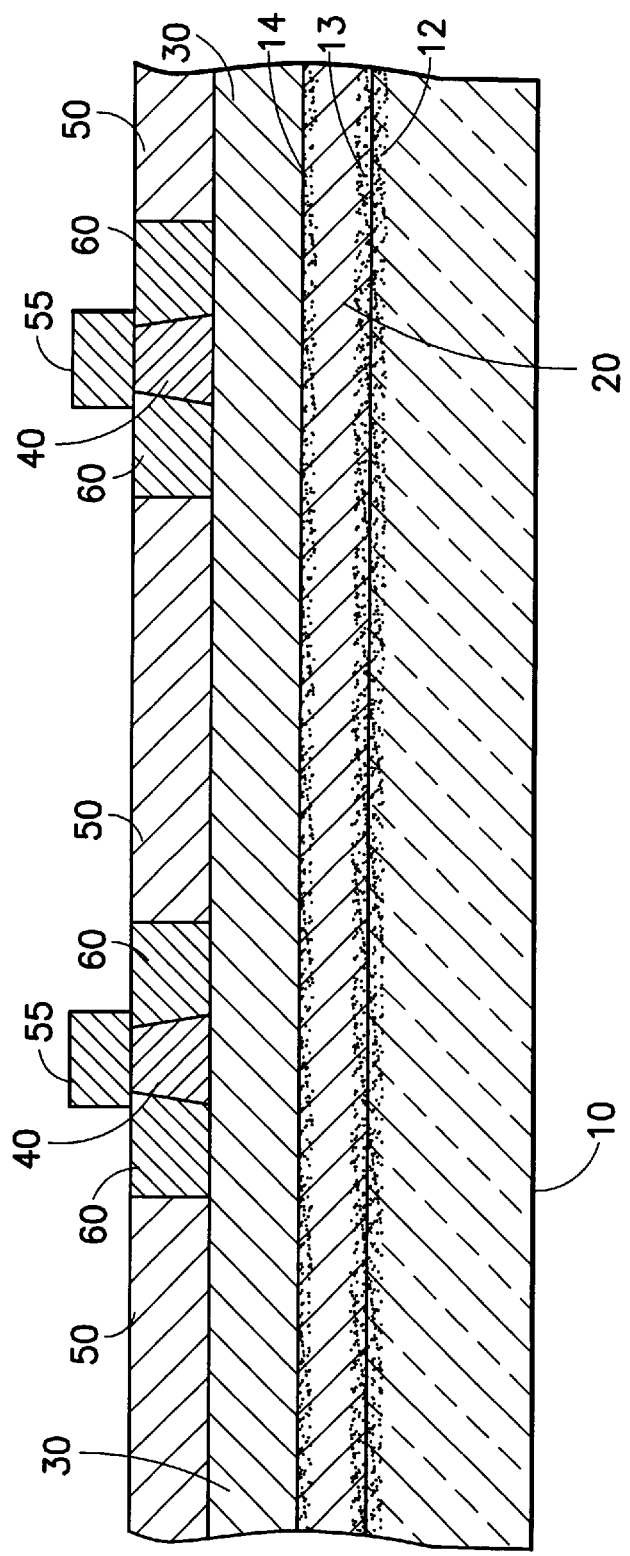

Case #6 in FIG. 6 is similar to Case #4 in FIG. 4 in that we have a uniformly doped region 20 with no bias contact. However in Case #6 the doping of the n-region 20 has been carefully controlled so that the net doping, donors minus acceptors, is small. Preferably, the net concentration of carriers is less than $10^{15}$ cm$^{-3}$. In this case, the thickness of the depletion regions 13 and 14 increase so that they merge together forming a fully depleted n-region 20. A fully depleted n-region has essentially no free carriers so it cannot be biased, and it has essentially infinite lateral resistance so that it does form a large area capacitor with the substrate 10. The capacitance, $C_{DEV-SUB}$, between the devices and the substrate is then given by $$\frac{1}{C_{DEVSUB}} = \frac{1}{C_{BOX}} + \frac{1}{C_{14}} + \frac{1}{C_{13}} + \frac{1}{C_{12}} \quad (7)$$

$$\approx \frac{t_{OX}}{\varepsilon_{OX}A_{DEV}} + \frac{t_{14}+t_{13}+t_{12}}{\varepsilon_{SI}A_{DEV}}$$

Note that in Equation 7 the capacitances $C_{12}$, $C_{13}$, $C_{14}$ depend approximately on the area of the device, $A_{DEV}$ and not the area of the n-region $A_{n-region}$ as in equation 5. Since the depletion regions have merged, the total depletion region thickness is $t_{12}+t_{13}+t_{14}$ which is significantly large enough to reduce the capacitance $C_{DEV-SUB}$ to a sufficiently low value. That is, the series combination of $C_{BOX}$ with the full depleted n-region 20 and the p-n junction region represent a significant improvement over standard technology Case #1.

Case #7

Figure 7:
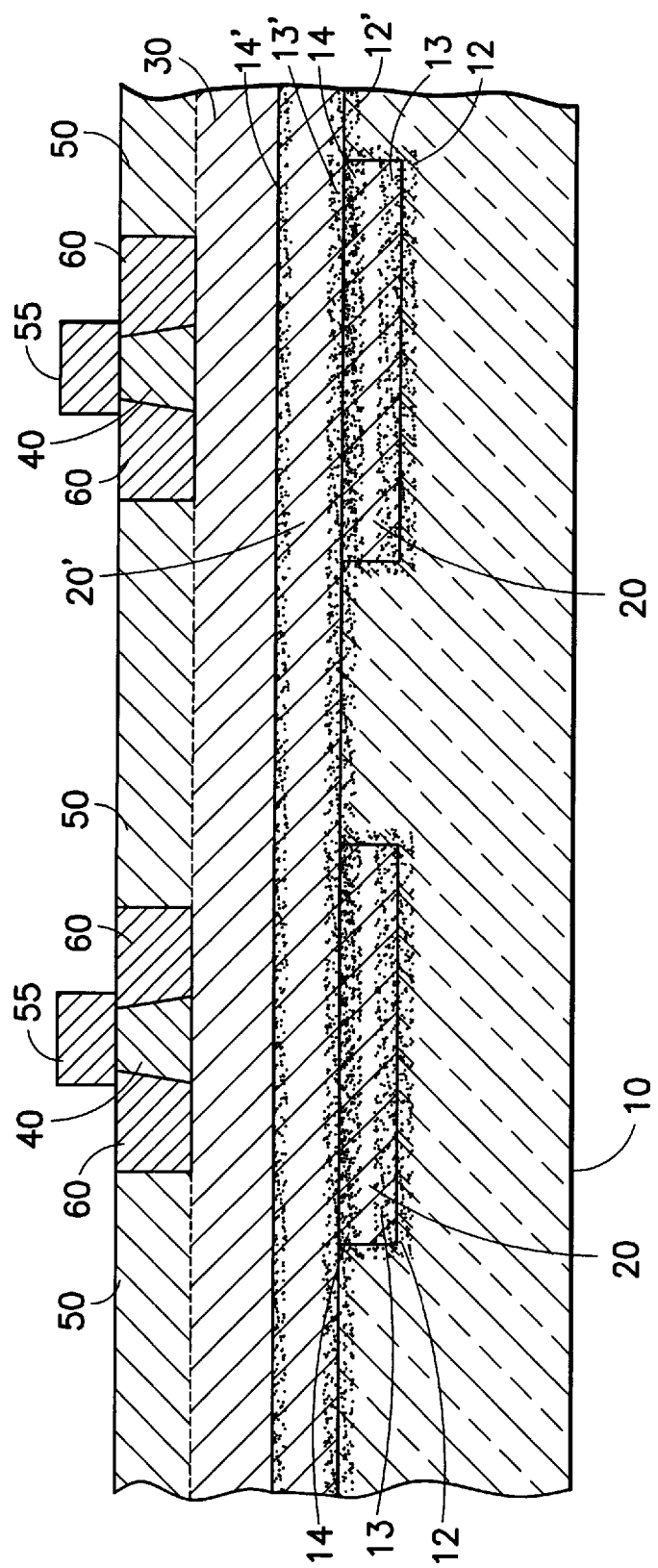

Case #7 in FIG. 7 has the fully depleted n-region of Case #6 combined with the patterned floating n-region of Case #5. It is not necessary to pattern the fully depleted n-region since a fully depleted region has essentially infinite lateral resistance. However, if process control is poor, a fully depleted n-region might not always be obtained. If this happens we still have a satisfactory structure because we have made a transition to the embodiment of Case #5.

Patterning the fully depleted n-region is less desirable since it costs extra process steps, however this must be evaluated together with the degree of process control necessary to produce a fully depleted n-region.

We claim:

1. A method of making an integrated circuit comprising the steps of:

preparing a p-type wafer having a buried insulating layer formed therein and a device layer of silicon above said buried insulating layer; and implanting a blanket implant of n-type dopant to form a fully depleted layer of silicon below said buried insulating layer.

2. A method of making an integrated circuit according to claim 1, in which said n-type dopant extends at least 50 nm below said buried insulating layer.

3. A method of making an integrated circuit according to claim 1, in which said n-type dopant extends about 500 nm below said buried insulating layer.

4. A method of making an integrated circuit according to claim 1, further comprising forming a set of field effect transistors and performing a second patterned implant to form a set of n-type regions below a set of transistors.

5. A method of making an integrated circuit comprising the steps of:
- preparing a p-type wafer having a buried insulating layer formed therein and a device layer of silicon above said buried insulating layer;
- implating a blanket implant of n-type dopant to form a fully depleted layer of silicon below said buried insulating layer;
- performing a second patterned implant to form a set of n-type regions below a set of active areas in said device layer; and
- forming a set of field effect transistors in said active areas.

6. A method of making an integrated circuit comprising the steps of:
- preparing a p-type wafer having a first magnitude of p-type dopants per cubic centimeter, a buried insulating layer formed therein and a device layer of silicon above said buried insulating layer; and
- implanting a blanket implant of n-type dopant below said buried insulating layer to form a fully depleted layer of silicon adjoining said buried insulating layer.

7. A method of making an integrated circuit according to claim 6, in which said blanket implant of n-type dopant has a magnitude of n-type dopants per cubic centimeter that is substantially equal to said first magnitude.

8. A method of making an integrated circuit according to claim 7, in which said blanket implant of n-type dopant has a magnitude of n-type dopants per cubic centimeter that differs from said first magnitude by an amount such that the net concentration of carriers is less than $10^{15}/cm^3$.

9. A method of making an integrated circuit according to claim 7, further comprising forming a set of field effect transistors and performing a second patterned implant to form a set of n-type regions below a set of transistors.

10. A method of making an integrated circuit comprising the steps of:
- preparing a p-type wafer having a first magnitude of p-type dopants per cubic centimeter, a buried insulating layer formed therein and a device layer of silicon above said buried insulating layer;
- implanting a blanket implant of n-type dopant below said buried insulating layer to form a fully depleted layer of silicon adjoining said buried insulating layer;
- performing a second patterned implant to form a set of n-type regions below a set of active areas in said device layer; and
- forming a set of field effect transistors in said active areas.

11. A method of making an integrated circuit comprising the steps of:
- preparing a p-type wafer having a first magnitude of p-type dopants per cubic centimeter, a buried insulating layer formed therein and a device layer of silicon above said buried insulating layer; and
- implanting a blanket implant of n-type dopant below said buried insulating layer to form, without the application of electrical bias, a fully depleted layer of silicon adjoining said buried insulating layer.

12. A method of making an integrated circuit according to claim 11, in which said blanket implant of n-type dopant has a magnitude of n-type dopants per cubic centimeter that is substantially equal to said first magnitude.

13. A method of making an integrated circuit according to claim 12, in which said blanket implant of n-type dopant has a magnitude of n-type dopants per cubic centimeter that differs from said first magnitude by an amount such that the net concentration of carriers is less than $10^{15}/cm^3$.

14. A method of making an integrated circuit according to claim 11, further comprising forming a set of field effect transistors and performing a second patterned implant to form a set of n-type regions below a set of transistors.

15. A method of making an integrated circuit comprising the steps of:
- preparing a p-type wafer having a first magnitude of p-type dopants per cubic centimeter, a buried insulating layer formed therein and a device layer of silicon above said buried insulating layer;
- implanting a blanket implant of n-type dopant below said buried insulating layer to form, without the application of electrical bias, a fully depleted layer of silicon adjoining said buried insulating layer;
- performing a second patterned implant to form a set of n-type regions below a set of active areas in said device layer; and
- forming a set of field effect transistors in said active areas.

* * * * *